United States Patent [19]

Nakagawa et al.

[11] Patent Number: 4,989,930
[45] Date of Patent: Feb. 5, 1991

[54] OPTOELECTRONICS PACKAGE

[75] Inventors: Eiichi Nakagawa; Junichiro Yamashita, both of Kanagawa, Japan

[73] Assignee: Mitsubishi Denki Kabushiki Kaisha, Tokyo, Japan

[21] Appl. No.: 301,437

[22] Filed: Jan. 25, 1989

[30] Foreign Application Priority Data

Jan. 28, 1988 [JP] Japan .................................. 63-18082

[51] Int. Cl.$^5$ .............................................. G02B 6/42
[52] U.S. Cl. ...................................... 350/96.2; 357/74
[58] Field of Search .................... 350/96.15, 96.2, 96.1; 357/17, 19, 30, 74, 80, 81

[56] References Cited

U.S. PATENT DOCUMENTS

| | | | |
|---|---|---|---|
| 3,840,889 | 10/1974 | O'Brien et al. | 357/81 |
| 4,399,541 | 8/1983 | Kovats et al. | 372/36 |
| 4,615,031 | 9/1986 | Eales et al. | 350/96.2 |
| 4,732,446 | 3/1988 | Gipson et al. | 350/96.2 |
| 4,752,109 | 6/1988 | Gordon et al. | 350/96.2 |
| 4,834,491 | 5/1989 | Aoki et al. | 350/96.2 |

OTHER PUBLICATIONS

H. Nakano et al., "Dual-In-Line Laser Diode Module for Fiber-Optic Transmission Up to 4 Gbits/s", Journal of Lightwave Technology, vol. LT-5, No. 10, Oct. 1987.
H. H. Meinke, Einfuhrung in die Elektrotechnik hoherer Frequenzen, 2nd edition, vol. 1, Springer-Verlag Berlin . . . 1965, p. 156 to 172.
Eisler, Paul: Gedruckte Schaltungen, Technologie der Folienatztechnik, Carl Hanser Verlag Munchen 1961, p. 281, (Chap. 20, gedruckte Mikrowellenschaltungen).
H. Nakano et al., "Dual-in-Line Laser Diode Module for Fiber-Optic Transmission Up to 4 Gbits/s", Journal of Lightwave Technology, vol. LT-5, No. 10, Oct. 1987.

*Primary Examiner*—John D. Lee
*Assistant Examiner*—John Ngo
*Attorney, Agent, or Firm*—Wolf, Greenfield & Sacks

[57] ABSTRACT

A novel optoelectronics package includes an optical semiconductor, an electronic cooling element carrying the optical semiconductor and electrically connected to one of the terminals thereof, a pair of transmission lines having distributed constant characteristics and an airtight vessel housing the optical semiconductor, cooling element and transmission lines. A grounding line of the transmission lines is connected between the terminal of the optical semiconductor and an external ground terminal fixed at the vessel. A signal line of the transmission line is connected between the other terminal of the optical semiconductor and an external signal terminal, whereby the stray capacitance of the cooling element is shorted by the distributed constant grounding line.

13 Claims, 3 Drawing Sheets

4,989,930

OPTOELECTRONICS PACKAGE

BACKGROUND OF THE INVENTION

1. Field of the Invention

The present invention relates to an improved optoelectronics package which permits high frequency operation and couples rays from a light emitting semiconductor element for use in optical transmission to an optical fiber or vice versa.

2. Prior Art

An optoelectronics package comprising a laser diode (hereinafter abbreviated as "LD") as an optical semiconductor will be described hereinafter.

FIG. 4 is a partially sectional view illustrating the configuration of the prior art optoelectronics package. As shown in Fig. 4, LD 1 and lens 2 are carried by a metallic carrier 3 which is fixed to an airtight vessel 5 via an electronic cooling element 4. Electric wiring for driving LD 1 consists of two independent thin gold wires 7a and 7b. The wire 7a connects an input terminal 6a for receiving a driving signal to a terminal of LD1, and the wire 7b connects the other input terminal 6b, or ground terminal, to the other terminal of LD1 through the carrier 3. The input terminal 6a is electrically insulated from the vessel 5 by insulating glass material 8. Rays 9 from LD 1 are condensed by the lens 2 and go out from the vessel 5 through an aperture 10 which is mounted to the vessel 5 by low melting glass material 11.

The prior art optoelectronics package 12 having such a configuration is normally used in conjunction with an optical fiber 13 which is adjusted in position such that the rays 9 from LD 1 enter the fiber 13. Further, optical fiber 13 is fixed to the optoelectronics package 12 via a holder 14. The electronic cooling element 4 is configured such that a temperature difference is developed between its top surface touching the carrier 3 and its bottom surface touching the vessel 5. In this configuration, the electronic cooling element 4 has a cooling capability such that the temperature of the carrier 3 and LD 1 can be kept constant in spite of any fluctuation in the temperature of the vessel 5.

FIG. 5 is a simplified equivalent electric circuit of the optoelectronics package of Fig. 4. As shown in Fig. 5, the input terminal 6a and LD 1 are connected to each other via an inductance ($L_A$) 15 of the gold thin wire. An Inductance ($L_B$) 16 of the gold thin wire 7b and a capacitance ($C_P$) 17, which is provided by the cooling element 4 as a stray capacitance, are connected in parallel between the input terminal 6b and LD 1. The equivalent electric circuit shown in Fig. 5 is a filter circuit in which the inductance ($L_B$) 16 and capacitance ($C_P$) 17 together produce a parallel resonance at a frequency fr $$\left( = \frac{1}{BP} \right)$$

which gives a high impedance. Therefore, the prior art optoelectronics package is disadvantageous in that the amplitude and phase of the signal transmitted to LD 1 have a large degradation in the vicinity of resonance frequency fr, disabling a faithful transmission of signal.

In order to eliminate such a disadvantage, the inductance ($L_B$) 16 or capacitance ($C_P$) 17 may be reduced to raise the frequency range at which the effect of the above-described filter circuit is greatly produced so that such an effect is less pronounced in a frequency range commonly used in telecommunications. However, the capacitance ($C_P$) 17 is inherent to the electronic cooling element 4 and therefore cannot be reduced. Inductance ($L_B$) 16 may be reduced by decreasing the length of the wire 7b or increasing the diameter of the wire 7b. However, either approach is disadvantageous in that it causes an increase in the thermal inflow from the vessel 5 to the carrier 3, deteriorating the cooling capability of the electronic cooling element 4.

SUMMARY OF THE INVENTION

It is therefore an object of the present invention to provide an optoelectronics package which eliminates the effect of capacitance of an electronic cooling element to enable a high speed drive or high frequency operation of LD without deteriorating the cooling capability of the electronic cooling element.

The above described and other objects of the present invention will become more apparent from the following detailed description and examples.

In accordance with an optoelectronics package of the present invention, the LD side of the electronic cooling element and the input terminal or ground terminal are connected to each other via transmission line whose equivalent electric circuit can be represented by a distributed constant circuit, such as a coaxial line or strip line. In other words, the grounding line of the distributed constant transmission line connects the ground terminal to the LD side of the cooling element.

In this configuration, the effect of capacitance of the electronic cooling element is negligible because the capacitance is shorted by the grounding line, and causes no undesired resonance. Thus, LD permits high frequency operation. Furthermore, since the heat conduction of such a transmission line is small, for example a ceramic is used as a substrate material of a strip line, the drop in the cooling capability of the electronic cooling element is negligibly small.

BRIEF DESCRIPTION OF THE DRAWINGS:

By way of example and to make the description more clear, reference is made to the accompanying drawings in which.

DETAILED DESCRIPTION OF A PREFERRED EMBODIMENT

Figure 1:
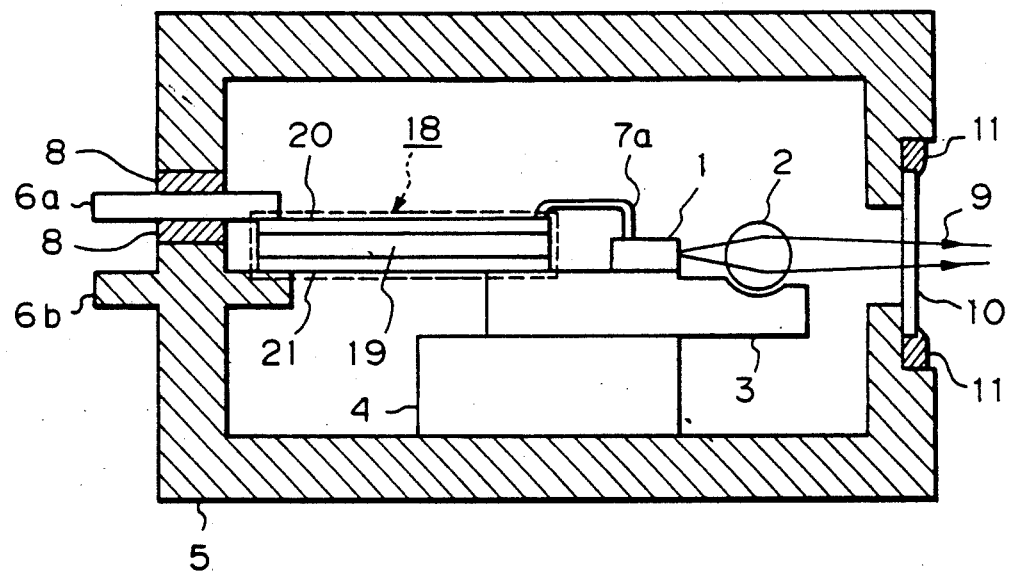
FIG. 1 is a partially sectional view illustrating the configuration of an embodiment of an optoelectronic package according to the present invention.
Figure 5:
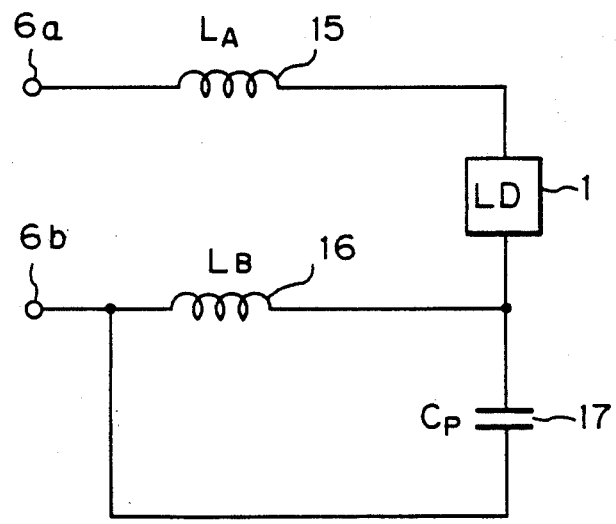
FIG. 5 shows a simplified equivalent electric circuit of the optoelectronic package of FIG. 4.

FIG. 1 is a partially sectional view illustrating the configuration of an embodiment of an optoelectronic package according to the present invention. Shown at 1, 2, 3, 4, and 5 are LD, lens, a metallic carrier, an electronic cooling element, an airtight vessel, respectively. Shown at 6a and 6b are an input terminal for receiving an electric signal for driving LD 1, and a ground terminal, respectively. Shown at 7a, 8, 9, 10, 11, and 18 are a gold thin wire an insulating glass material for insulating between the input terminals 6a and 6b, rays from LD 1, an aperture for rays 9, glass material for sealing the gap between the aperture 10 and a vessel 5, and a microstrip line as a distributed constant line, respectively.

In the microstrip line 18, dielectric ceramic (dielectric substrate material) 19 is provided with a thin film gold pattern of several micrometer thickness on both sides thereof. Further, an upper gold pattern 20 is connected to the input terminal 6a and the wire 7a while a lower gold pattern 21 is connected to the ground terminal 6b and a terminal of LD 1 through the carrier 3.

Figure 2:
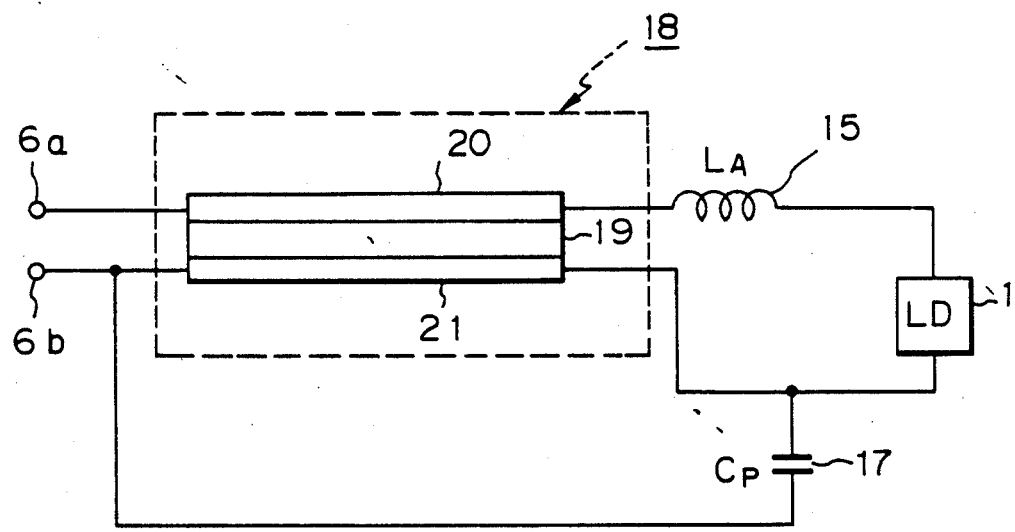
FIGS. 2 and 3 show a simplified equivalent electric circuit of the optoelectronic package of FIG. 1.

FIG. 2 is a diagram illustrating a simplified equivalent electric circuit of the optoelectronics package of FIG. 1. Shown at 15 and 17 are the inductance ($L_A$) of the wire 7a and the capacitance ($C_p$) of the electronic cooling element 4. The inductance 15 and upper gold pattern 20 of the microstrip line 18 are connected in series with each other between LD 1 and the input terminal 6a while the capacitance 17 and the lower gold pattern 21 of the microstrip line 18 are connected in parallel between LD 1 and the ground terminal 6b.

Figure 3:
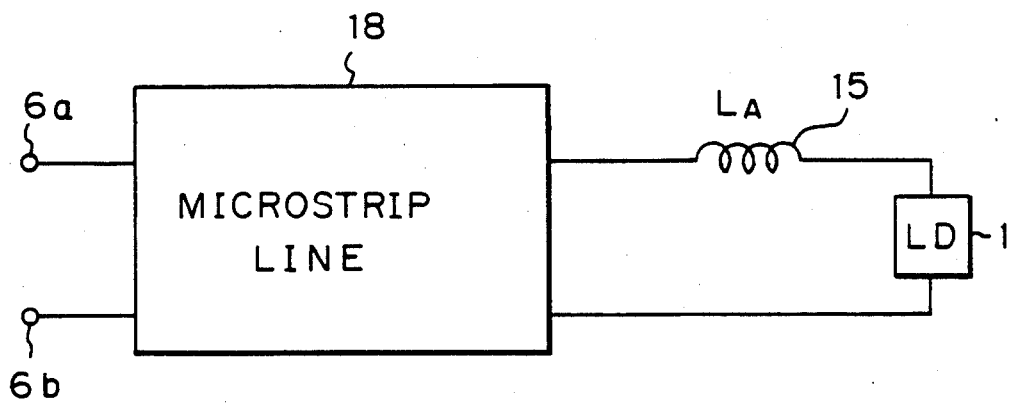
Figure 4:
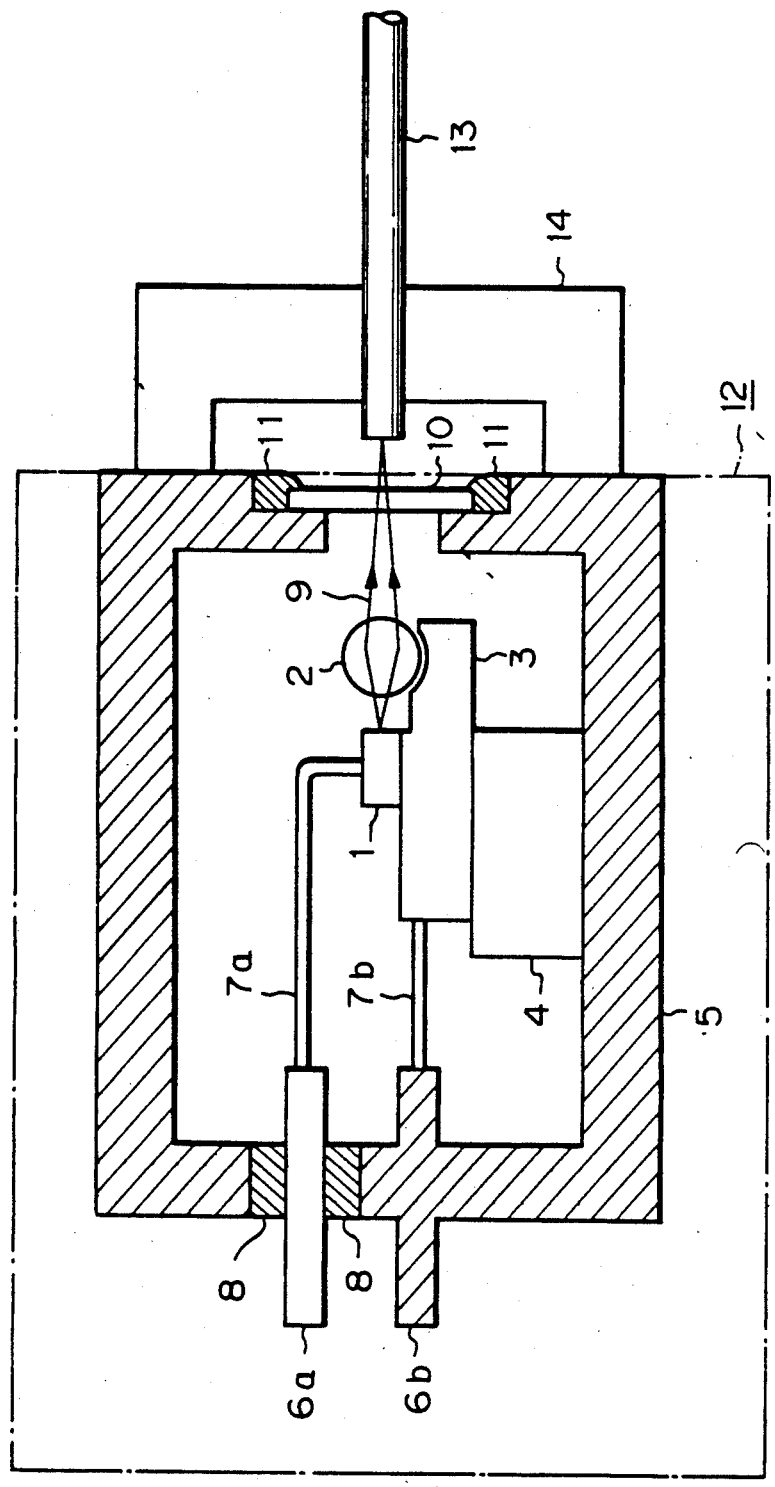
FIG. 4 is a partially sectional view illustrating the configuration of the prior art optoelectronic package.

An electric current mostly passes through the lower gold pattern or grounding pattern 21 but hardly through the capacitance ($C_p$) 17 between the ground terminal 6b and LD 1. This is because the lower gold pattern 21 has a higher electric conductivity in a wide frequency range and a storage electromagnetic coupling with the upper gold pattern 20 of the microstrip line 18 than the capacitance ($C_p$) 17. (Only a distributed constant line can derive a strong electromagnetic coupling.) Therefore, the capacitance ($C_p$) 17 can be neglected. Thus, the equivalent electric circuit of FIG. 2 can be simplified to an equivalent electric circuit shown in FIG. 3. The equivalent electric circuit shown in FIG. 3 does not produce a harmful resonance described above.

As described above, the present embodiment does not produce a harmful resonance because the capacitance shorted by the grounding pattern 21 of the microstrip line, or distributed constant line 18 and therefore enables a faithful transmission of signal even if LD 1 is driven in a high frequency range.

On the other hand, the heat conduction of the microstrip line 18 causes an increase in the flow of heat from the vessel 5 to the carrier 3. However, since the upper gold pattern 20 and the lower gold pattern 21 of the microstrip line 18 are deposited thin gold films of several micrometer thickness, such a heat conduction is small enough to be neglected. Microstrip line 18 can be embodied in a thickness of about 0.4 mm and a width of about 1 mm. Therefore, the increase in the flow of heat due to the dielectric ceramic 19 is not significantly great. Thus, the drop in the cooling capability of the electronic cooling element 4 is small.

Furthermore the drop in the cooling capability of the electronic cooling element 4 can further be reduced to a negligible level by the use of a ceramic having an extremely low heat conductivity such as forsterite, steatite or zircon as the dielectric ceramic 19 of the microstrip line 18.

While the invention has been described with a embodiment in which the microstrip line 18 is used as a distributed constant line, other embodiments such as one in which other distrbed lines such as coaxial lines, coplaner lines, coplaner striplines or coupled microstrip lines are used can exhibit similar effects.

While the invention has been described with an embodiment in which LD 1 is used as an optical semiconductor other embodiments such as one in which other light emitting semiconductor elements or light receiving semiconductor elements are used can exhibit similar affects.

Thus, the optoelectronics package according to the present invention is characterized by a configuration in which the LD side of an electronic cooling element and an input terminal are connected to each other via a transmission line whose equivalent electric circuit is represented by a distributed constant circuit, such as a coaxial line or strip line. In such a configuration, an adverse affect of the capacitance of the electronic cooling element can be eliminated, enabling high frequency operation. Furthermore, since the heat conductivity of a distributed constant line such as a strip line is not significantly great, the increase in the flow of heat from vessel to carrier can be reduced, minimizing the drop in the cooling capability of the electronic cooling element.

While the invention has been described in detail and with reference to specific embodiments thereof, it will be apparent to those skilled in the art that various changes and modifications can be made therein without departing from the spirit and scope thereof.

What is claimed is:

1. An optoelectronics package comprising a semiconducting optical element, an electronic cooling element electrically coupled to said semiconducting optical element, an airtight vessel enclosing said semiconducting optical element and said electronic cooling element and having a signal terminal integrally formed therewith, and a microstrip transmission line comprising a dielectric substrate having a thin metal film pattern deposited on two sides thereof, one side of said microstrip electrically coupling said first signal terminal to said electronic cooling element, a second side of said microstrip electrically coupling said semiconducting optical element to a second signal terminal.

2. An optoelectronics package as claimed in claim 1, wherein said thin metal film pattern comprises a thin film gold pattern.

3. An optoelectronics package according to claim 1, wherein said distributed constant line comprises a dielectric substrate with thin gold film patterns deposited on two surfaces thereof.

4. An optoelectronics package according to claim 1, wherein said optical semiconductor comprises a light emitting element and said external signal terminal receives an input signal to transmit to said light emitting element through said signal line of said distributed constant line.

5. An optoelectronics package according to claim 1, wherein said optical semiconductor comprises a light receiving element and said external signal terminal outputs a signal from said light receiving element through said signal line of said distributed constant line.

6. An optoelectronics package comprising:
    a semiconductor optical element;
    an electronic cooling element electrically coupled to said semiconductor optical element;
    an airtight vessel enclosing said optical element and said electronic cooling element and electrically coupled to said electronic cooling element, said vessel having a pair of electrical input terminals, one of said input terminals being integrally formed with said vessel; and
    a transmission line means for electrically coupling said optical element and said electronic cooling element to said input terminals so as to eliminate inherent capacitive effects of said electronic cooling element.

7. The optoelectronics package of claim 6 wherein said transmission line means comprises a microstrip of dielectric substrate having a thin gold film pattern deposited on two sides thereof.

8. The optoelectronics package of claim 7 wherein a first side of said microstrip electrically couples said electronic cooling element with said one input terminal.

9. The optoelectronics package of claim 8 wherein a second side of said microstrip electrically couples said semiconducting optical element with said other input terminal.

10. The optoelectronics package of claim 9 wherein the amount of electric current flowing through said first side of said microstrip is substantially greater than the electric current flowing through the juncture of said vessel and said electronic cooling element.

11. The optoelectronics package of claim 6 further comprising an electrically conductive carrier element disposed intermediate said semiconductor optical element in said electronic cooling element.

12. The optoelectronics package of claim 6 further comprising a lens for condensing light rays emitted by said semiconductor optical element.

13. An optoelectronics package comprising:
an optical semiconductor having first and second terminals;
an electronic cooling means for carrying said optical semiconductor on a side thereof which is electrically connected to said first terminal of said optical semiconductor;
a distributed constant line having signal and grounding lines; and
an airtight vessel housing said optical semiconductor, cooling means and distributed constant line, and having external signal and ground terminals fixed thereat;
wherein said grounding line of said distributed constant line is coupled between said first terminal of said optical semiconductor and said external ground terminal, while said signal line of said distributed constant line is connected between said second terminal of said optical semiconductor and said external signal terminal.

* * * * *